United States Patent
Na et al.

(10) Patent No.: US 8,591,669 B2
(45) Date of Patent: Nov. 26, 2013

(54) METHOD OF TEXTURING POLYCRYSTALLINE IRON/GALLIUM ALLOYS AND COMPOSITIONS THEREOF

(75) Inventors: Suok Min Na, Incheon (KR); Alison Behre Flatau, Potomac, MD (US)

(73) Assignee: University of Maryland, College Park, MD (US)

( * ) Notice: Subject to any disclaimer, the term of this patent is extended or adjusted under 35 U.S.C. 154(b) by 418 days.

(21) Appl. No.: 11/286,078

(22) Filed: Nov. 23, 2005

(65) Prior Publication Data

US 2008/0115864 A1 May 22, 2008

Related U.S. Application Data

(60) Provisional application No. 60/630,404, filed on Nov. 23, 2004.

(51) Int. Cl.
*H01F 1/01* (2006.01)

(52) U.S. Cl.
USPC ............................................ 148/121; 148/306

(58) Field of Classification Search
USPC ......................................... 148/120–121, 306
See application file for complete search history.

(56) References Cited

U.S. PATENT DOCUMENTS

| | | | |
|---|---|---|---|
| 3,130,092 | A | 4/1964 | Kohler et al. |
| 4,308,474 | A | 12/1981 | Savage et al. |
| 5,693,154 | A | 12/1997 | Clark et al. |
| 2003/0010405 | A1* | 1/2003 | Clark et al. ................ 148/108 |

OTHER PUBLICATIONS

Henderson et al., "Metallurgical Dictionary", Reinhold Publishing Corp., 1953, pp. 319 and 320.*

Srisukhumbowornchai, "Development of Highly Magnetostrictive Fe-Ga and Fe-Ga-Al Alloy", A Doctor of Philosophy dissertation submitted to the faculty of the University of Utah, Aug. 2001.*

Kellogg, "Development and Modeling of Iron-Gallium Alloys", A Doctor of Philosophy dissertation submitted to the faculty of Iowa State University, 2003.*

Flatau, "An Introduction to a New Magnetostrictive Material: Galfenol", Dept of Aerospace Engr., Univ. of Maryland, EAS IV (2004).

Letcher et al., "Domain structure of as-cast and annealed FeSiB amorphous wires", J. Appl. Phys., 69 (8), pp. 5331-5333 (1991).

Clark et al., "Extraordinary magnetoelasticity and lattice softening in bcc Fe-Ga alloys", J. of Appl. Phys., vol. 93, No. 10, pp. 8621-8623 (2003).

(Continued)

*Primary Examiner* — Roy King
*Assistant Examiner* — Timothy Haug
(74) *Attorney, Agent, or Firm* — Carter, DeLuca, Farrell & Schmidt, LLP

(57) ABSTRACT

The present disclosure is directed to a method of shaping a starting material of polycrystalline Fe—Ga alloy sheet of varying texture or crystal orientation. The method includes texturing the surface of the Fe—Ga alloy sheet to re-orient polycrystalline Fe—Ga crystals of the polycrystalline Fe—Ga alloy sheet to increase the uniformity of the crystal orientation of the Fe—Ga alloy sheet. The texturing step includes: initially deforming the Fe—Ga alloy sheet by hot rolling; subsequently deforming the previously hot rolled Fe—Ga alloy sheet by warm rolling; and annealing the previously warm rolled Fe—Ga alloy sheet. The method provides an alloy having a saturation magnetostriction potential greater than 60 ppm in applied fields of between 200-600 Oersted. During the annealing step $H_2S$ gas is added to introduce sulfur for promoting surface-energy-induced selective growth of {110} grain. The annealing step is performed in an atmosphere of argon gas.

9 Claims, 21 Drawing Sheets

(56) References Cited

OTHER PUBLICATIONS

Srisukhumbowornchai et al., "Crystallographic Textures in Rolled and Annealed Fe-Ga and Fe-Al Alloys", Metallurgical and Mat. Trans. A, vol. 35A, pp. 2963-2970 (2004).

Heo et al., "Correlation Between Interfacial Segregation and Surface-Energy-Induced Selective Grain Growth in 3% Silicon-Iron Alloy", Acta mater, 48, pp. 2901-2910 (2000).

McKnight, "Magnetostrictive Materials Background", UCLA—Active Materials Lab, www.aml.seas.ucla.edu/research/areas/magnetostrictive/overview (2006).

Na et al., "Magnetostriction and surface-energy-induced selective grain growth in rolled Galfenol doped with sulfur", Dept. of Aerospace Eng., Univ. of Maryland, 2006.

Cullen et al., "Magnetoelasticity of Fe-Ga and Fe-Al alloys", J. of Magnetism and Magnetic Mat., 226-230, pp. 948-949 (2001).

Wun-Fogle et al., "Magnetostriction of Stress Annealed Fe-Ga-Al and Fe-Ga Alloys Under Compressive and Tensile Stress", Smart Str. And Mat. 2004: Active Mats.: Behavior and Mech., Proc. Of SPIE, vol. 5387, pp. 468-475 (2004).

Wun-Fogle et al., "Magnetostriction of Terfenol-D Heat Treated Under Compressive Stress", IEEE Transactions on Magnetics, vol. 35, No. 5, pp. 3817-3819 (1999).

Kramer, "Nucleation and Growth Effects in Thin Ferromagnetic Sheets: A Review Focusing on Surface Energy-Induced Secondary Recrystallization", Metallurgical Transactions A, vol. 23A, pp. 1987-1998 (1992).

Kohler, "Promotion of Cubic Grain Growth in 3% Silicon Iron by Control of Annealing Atmosphere Composition", J. of Appl. Physics, Supp. to vol. 31, No. 5, pp. 408S-409S (1960).

Kellogg et al., "Quasi-Static Transduction Characterization of Galfenol", Proceedings of IMECE '03, 2003 ASME Intnl. Mech. Eng. Congress, pp. 1-8 (2003).

Guruswamy et al., "Strong, Ductile, and Low-Field-Magnetostrictive Alloys Based on Fe-Ga", Scripta mater, 43, pp. 239-244 (2000).

Lograsso et al., "Structural transformations in quenched Fe-Ga alloys", J. of Alloys and Compounds, 350, pp. 95-101 (2003).

Kellogg et al., "Temperature and stress dependencies of the magnetic and magnetostrictive properties of $Fe(0.81)Ga(0.19)$", J. of Appl. Physics, vol. 91, No. 10, pp. 7821-7823 (2002).

Restorff et al., "Temperature and stress dependences of the magnetostriction in ternary and quaternary Terfenol alloys", J. of Appl. Physics, vol. 87, No. 9, pp. 5786-5788 (2000).

Kellogg et al., "Texture and grain morphology dependencies of saturation magnetostriction in rolled polycrystalline $Fe(83)Ga(17)$", J. of Appl. Physics, vol. 93, No. 10, pp. 8495-8497 (2003).

* cited by examiner

FIGURE 18(a)
FIGURE 18(b)
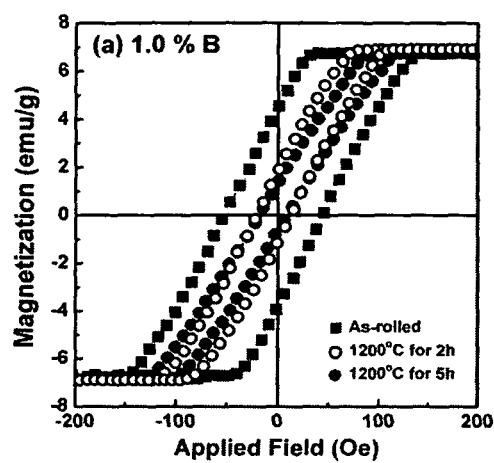
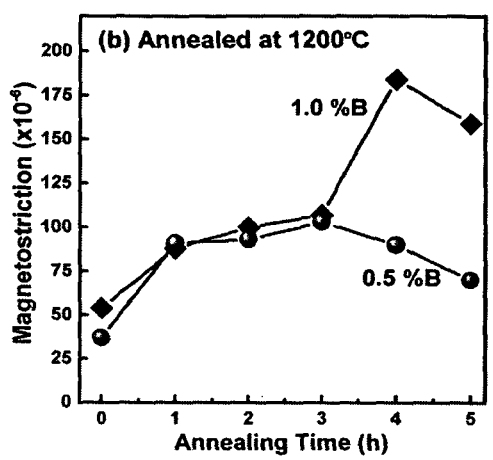

METHOD OF TEXTURING POLYCRYSTALLINE IRON/GALLIUM ALLOYS AND COMPOSITIONS THEREOF

CROSS REFERENCE TO RELATED APPLICATIONS

This application claims the benefit of and priority to U.S. Provisional Patent Application Ser. No. 60/630,404 filed on Nov. 23, 2004, the entire disclosure of which is hereby incorporated by reference.

GOVERNMENT RIGHTS

The present disclosure was made with Government support under grant # F3361503C3320 awarded by the United States Department of Defense. The Government has certain rights in the present disclosure.

BACKGROUND

1. Technical Field

The present disclosure relates to metal materials suitable for magnetostrictive actuators and sensors. More particularly, the present disclosure provides iron/gallium (Fe—Ga) sheet materials with a textured surface and a process for texturing the sheet materials.

2. Background of Related Art

Iron/gallium (Fe—Ga) alloys are known as a magnetostrictive alloy composition called Galfenol. Magnetostrictive materials are broadly defined as materials that undergo a change in shape due to change in the magnetization state of the material. Nearly all ferromagnetic materials exhibit a change in shape resulting from magnetization change. In materials such as iron, the change in length is on the order of 10 parts per million (ppm). Such shape changes of 10 ppm or less are not very useful.

Alloys which exhibit magnetostrictive properties such as greater than 50 ppm can be problematic in that the magnetostrictive properties are generally obtainable by providing very large magnetic fields such as greater than 1000 oersteds, or extremely low temperatures such as below 50° C., or both. Having to provide a large magnetic field, or hold an alloy at low temperatures in order to change the shape of the alloy is undesirable and unacceptable for many engineering purposes. Thus, materials capable of magnetostrictive strains (A) on the order of 100 ppm or greater with low saturation fields of less than several hundred oersteds with limited temperature dependence are desirable.

Attempts have been made to solve these problems by using alloys incorporating rare earth materials, such as Terfenol-D, a specially formulated alloy of terbium, dysprosium, and iron that exhibits magnetostriction at room temperature and relatively small applied fields. Terfenol-D overcomes the temperature problem by incorporating a $RFe_2$ microstructure which raised the curie temperature above room temperature. The necessary magnetic field was reduced by balancing the ratio of terbium and dysprosium. However, Terfenol-D is not suitable for all engineering purposes and it may crack when subjected to certain stresses such as being made into a sheet. Moreover, there is a significant cost in manufacturing the material.

Although iron/gallium (Fe—Ga) alloys are magnetostrictive, known polycrystalline iron/gallium compositions have not been very useful because they are brittle and susceptible to cracking when shaped into a sheet. For example, when iron/gallium alloy is subjected to hot rolling at 1000° C., it forms brittle sheets that fracture under low stress conditions. Accordingly, thin sheets which are desirable for use at higher frequencies are problematic to form. Thus, there remains room for improvement in formulating polycrystalline Fe—Ga compositions, and especially to provide Fe—Ga alloy compositions having: large saturation magnetostriction potential in low applied fields; excellent mechanical strength; excellent ductility; and excellent sheet formation characteristics when compared to state-of-the-art alloys.

SUMMARY

It has now been found that it is possible to texture polycrystalline Fe—Ga alloys to have a saturation magnetostriction potential greater than 60 ppm in applied fields such as between about 200-600 Oersted (OE), having excellent mechanical strength, excellent ductility, and excellent sheet forming qualities when compared to state-of-the-art alloys. Iron/gallium (Fe—Ga) compositions are provided herein suitable for use in magnetostrictive actuators and sensors as shown by having a saturation magnetostriction potential greater than 60 ppm in applied fields lower than 250 Oe, excellent mechanical strength, and excellent ductility. In embodiments, the present Fe—Ga alloy compositions also contain addition elements such as molybdenum, sulfur and/or boron. Sulfur addition element assists the formation of selective grain growth controlled by surface-energy-induced recrystallization. Boron addition element improves ductility due to suppression of grain boundary fracture. The present Fe—Ga alloys may be made by following a series of progressive manufacturing steps that convert Fe—Ga alloy of varying texture or crystal orientation to a polycrystalline material having an increasingly uniform crystal orientation such as the {100}<001> orientation or cube texture. The present methods for texturing Fe—Ga compositions include the steps of contacting the Fe—Ga alloy with additions, and annealing the Fe—Ga alloys through various temperatures in a controlled environment.

BRIEF DESCRIPTION OF THE DRAWINGS

FIGS. 18(a) and 18(b) show plots of magnetic and magnetostrictive properties as a function of annealing time in Boron added alloy sheets, respectively.

DETAILED DESCRIPTION OF THE PREFERRED EMBODIMENTS

The present disclosure relates to iron/gallium (Fe—Ga) alloy compositions having a saturation magnetostriction potential greater than 60 ppm in applied fields lower than 600 OE, excellent mechanical strength, excellent ductility, and excellent sheet forming characteristics.

In embodiments, Fe—Ga alloy compositions in accordance with the present disclosure have a saturation magnetostriction potential above 100 ppm in applied magnetic fields such as between about 200-600 Oe. These compositions can display insignificant temperature dependence in temperatures between −20° C. to 80° C. Accordingly, compositions in accordance with embodiments of this disclosure can be effective in making products where a magnetostriction potential of greater than 60 ppm is needed with limited temperature dependence. Such compositions would be suitable for use in magnetostrictive actuators and sensors, as well as for forming shapes having a high aspect ratio such as a sheet material, film, wire, mems sputtered film, electrodeposition film, or combinations thereof.

Fe—Ga alloy compositions are a mixture of two metals namely iron and gallium, having the general formula $Fe_{100-x}Ga_x$ for a single crystal, where X is atomic percent. As used herein, all percentages are atomic percent (at. %) which generally refers to the number of atoms of an element per unit volume divided by the number of atoms per unit volume of the substance containing the element. In embodiments, alloys in accordance with the present disclosure have a polycrystalline orientation. As used herein the term "polycrystalline" refers or relates to alloys composed of aggregates of crystals. State-of-the-art polycrystalline Fe—Ga compositions tend to lack uniformity and are made up of grains of crystalline material that are randomly oriented relative to one another. In particular, the assorted crystal orientations include the {100}<001>, {110}<001>, and {111}<211> crystal orientations according to the standard notation of Miller's indices. This lack of uniformity in known Fe—Ga compositions can be problematic resulting in brittle polycrystalline alloys susceptible to cracking.

In embodiments in accordance with the present disclosure, polycrystalline Fe—Ga crystals are re-oriented to increase the uniformity of the crystal orientation therein. For example, Fe—Ga alloy compositions having a random assortment of crystals including the {100}<001>, {110}<001>, and {111}<211> orientation, may be re-oriented to a more uniform orientation, such as by increasing the total frequency of the cube crystal orientation ({100}<001>). This process of texturing to a more uniform state provides iron/gallium (Fe—Ga) alloys having a saturation magnetostriction potential greater than 60 ppm in applied fields lower such as between 200-600 Oe, excellent mechanical strength, and excellent ductility.

Figure 1:
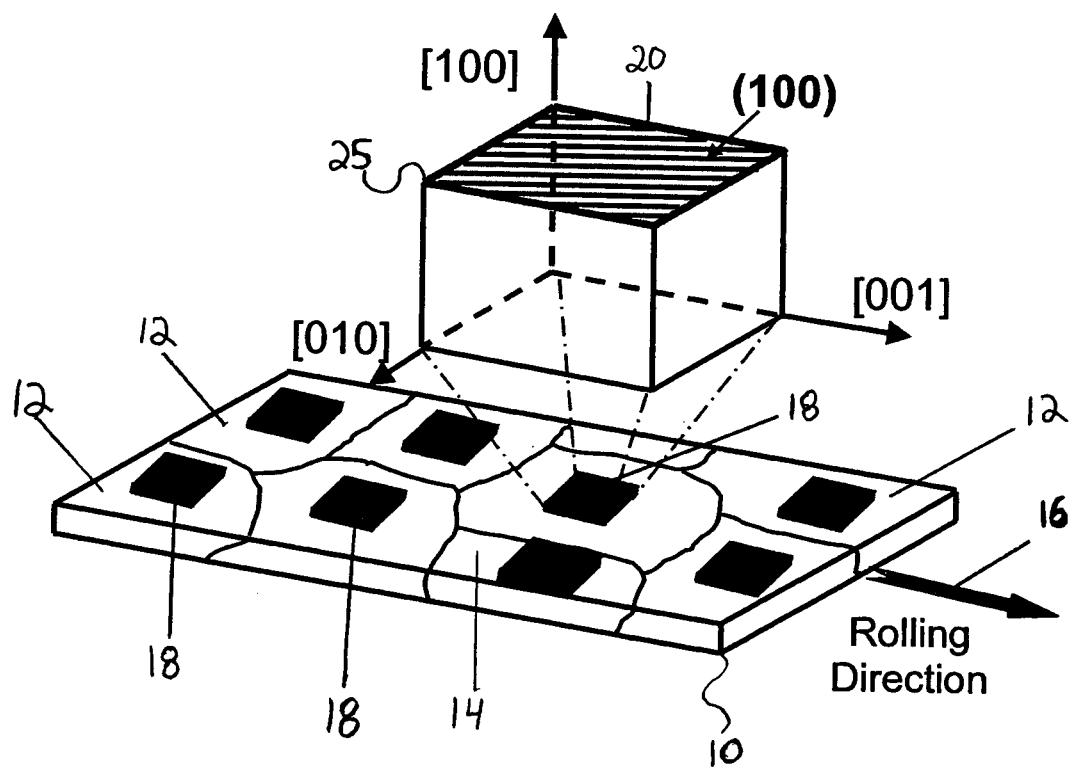
FIG. 1 is a schematic illustration of Fe—Ga alloy having a cube texture.

Referring now to FIG. 1, a schematic illustration of Fe—Ga alloy sheet material having the {100}<001> crystal orientation is shown. Fe—Ga sheet material 10 is shown having a plurality of grains 12 in surface 14. Arrow 16 indicates the rolling direction of sheet 10 during compression of the alloy. A plurality of cube shaped crystals 18 are schematically shown embedded in surface 14. Crystals 18 are oriented so that the cube edge 20 remains parallel to the rolling direction and in the plane of surface 14. Such an orientation by the Miller's indices and as used herein is referred to as a cube texture. This is more easily viewed by referring to cube 25 which is an enlarged view of a single crystal 18 in accordance with the present disclosure having a cube texture. Cube 25 is oriented so that cube edge 20 remains parallel to the rolling direction as shown by arrow 16 and in the plane of surface 14. In fact, four of the cube edges are parallel to the direction of the rolling, and the top face is parallel to surface 14 of sheet 10. Accordingly, cube 25 has a cube texture.

Figure 2:
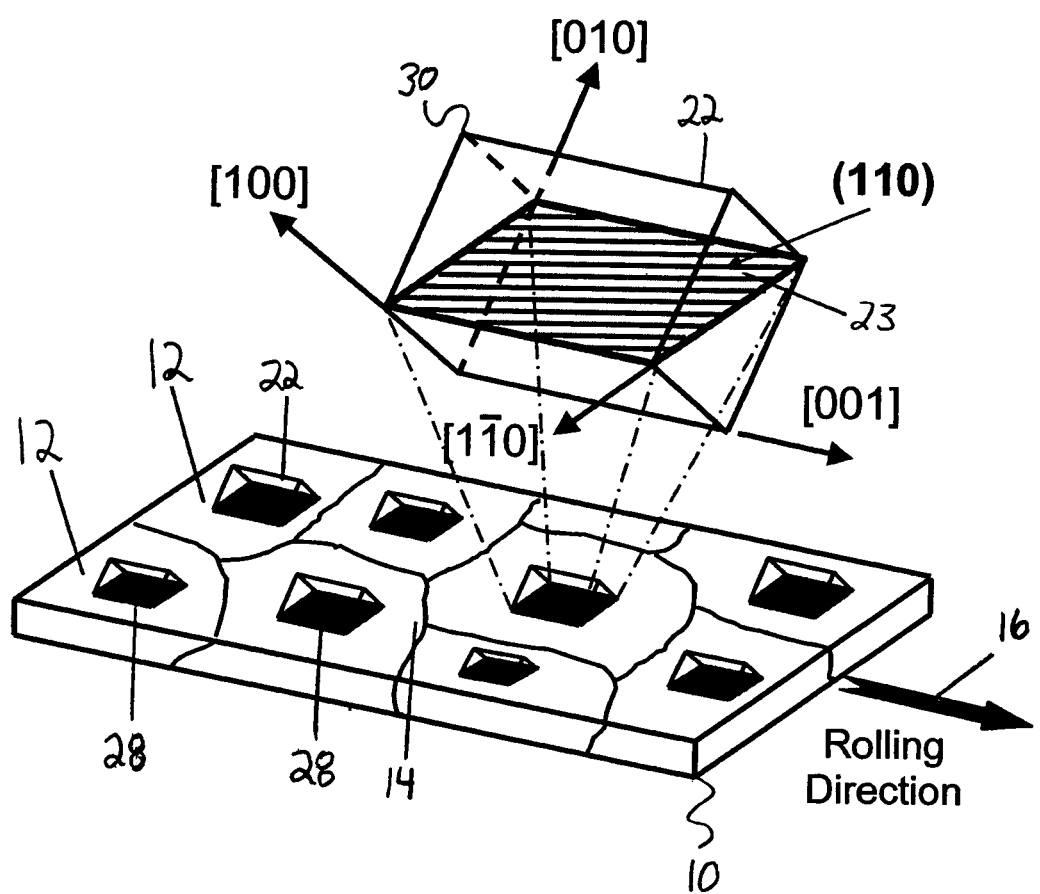
FIG. 2 is a schematic illustration of Fe—Ga alloy having a goss texture.

In additional embodiments in accordance with the present disclosure, the crystals of polycrystalline Fe—Ga compositions are oriented to obtain a crystal orientation designated as {110}<001> according to the standard notation of Miller's indices. Referring to FIG. 2, a schematic illustration of the {110}<001> orientation is shown. Sheet material 10 is shown having a plurality of grains 12 in surface 14. Arrow 16 shows the rolling direction of sheet 10 during compression. A plurality of cube shaped crystals 28 are shown embedded in top surface 14. Crystals 28 are oriented so that cube edge 22 remains parallel to the rolling direction; however no outer face of the cube lies parallel to surface 14 of sheet 10. Such an orientation by the Miller's indices and as used herein is referred to as a goss texture. This is more easily viewed by referring to cube 30 which is an enlarged view of a crystal 28 in accordance with the present disclosure having a goss texture. Cube 30 is oriented so that cube edge 22 remains parallel to the rolling direction as shown by arrow 16 and in the plane of surface 14, however, no face of cube 30 lies parallel to surface 14. Only internal face 23 is shown parallel to the rolling direction. Accordingly, cube 30 has a goss texture, also referred to as a cube-on-edge type.

To date it has not been possible to attain sheets with a more uniform texture of cubes with commercial reproducibility and at commercial cost by starting with a polycrystalline Fe—Ga alloy and texturing the crystals therein by an annealing process. However, the methods of manufacturing and compositions in accordance with the present disclosure have a substantially uniform texture by providing an increased number of cube or goss textured crystals than Fe—Ga alloys that have not been textured in accordance with the present disclosure.

The increased uniformity of the polycrystalline Fe—Ga composition is made possible by following a series of progressive manufacturing steps which convert Fe—Ga alloy of varying texture or crystal orientation to a predetermined polycrystalline material having more crystals in single orientation such as the {100}<001> orientation or cube texture. The process is started by pre-selecting Fe—Ga compositions having addition elements added thereto. Addition elements are added in amount necessary to obtain the desired effect. For example, addition elements may be added in an amount sufficient to promote the formation of selective grain growth controlled by surface-energy-induced recrystallization. Moreover, addition elements may be added in an amount sufficient to improve the ductility due to suppression of grain boundary fracture. Depending on needs, the addition elements may be selected and contained alone or in combination. However, the content of addition elements should not be sufficient to increase thermal deformation resistance to an undesirable extent or to deteriorate the chemical convertibility and broad surface treatment characteristics of the alloy. Accordingly, in embodiments the total content of the addition elements is between 0.001% to about 3.0% of the total alloy composition.

One non-limiting example of a suitable addition element for use in accordance with the present disclosure is sulfur which may assist the formation of selective grain growth controlled by surface-energy-induced recrystallization. Accordingly, Fe—Ga alloys suitable for use in accordance with the present disclosure can be pre-selected to have a sulfur content sufficiently high to assist the formation of selective grain growth. In embodiments, suitable sulfur content is from about 0.005% to about 0.50 at. % of the total composition.

Figure 3A:
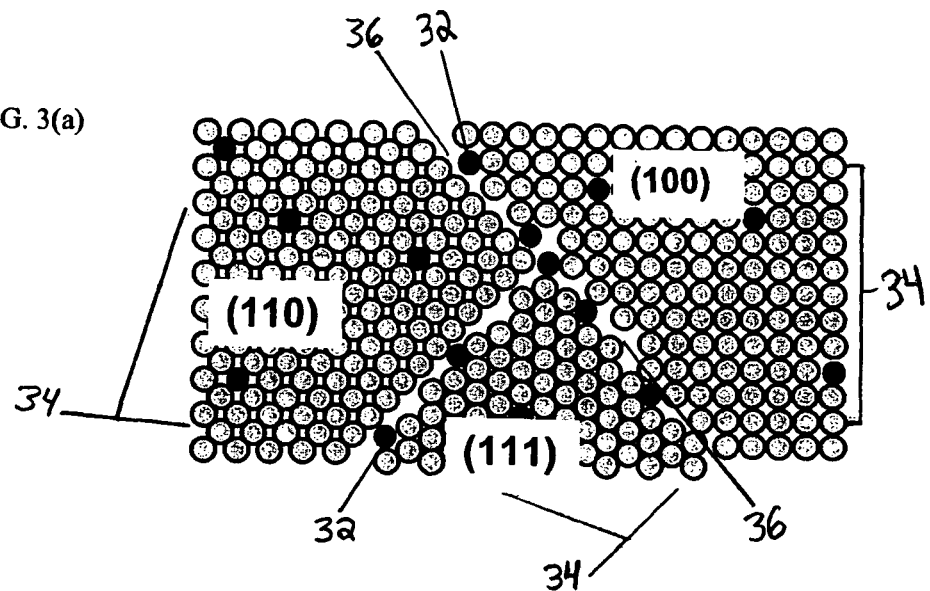
FIG. 3(a) is a schematic illustration of Fe—Ga grain with sulfur before surface-energy-induced selective grain texturing.

Referring now to FIG. 3(a) a schematic drawing is shown of Fe—Ga material having an assorted grain orientation shown as {100}, {110} and {111} grains in a sheet of Fe—Ga alloy. Here, the surface energy is distributed over the metal such that the surface energy of those crystals in the $\lambda 110$ orientation is greater than the surface energy of those crystals in the $\lambda 100$ orientation, which is greater than the surface energy of those crystals in the $\lambda 111$ orientation. Accordingly, the initial surface energy is characterized that $\lambda 110 < \lambda 100$ $\lambda 111$. FIG. 3(a) further shows a distribution of sulfur 32 in grain 34 and grain boundaries 36 before annealing in accordance with the present disclosure.

Figure 3B:
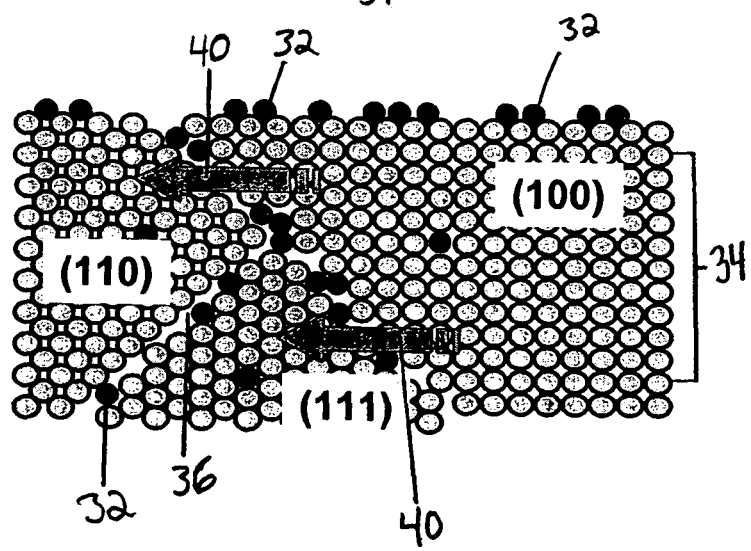
FIG. 3(b) is a schematic illustration of Fe—Ga cube grain growth by the interfacial segregation of sulfur.

Referring now to FIG. 3(b), a schematic drawing is shown of Fe—Ga material having an assorted grain orientation showing {100}, {110} and {111} orientations in a sheet of Fe—Ga alloy during annealing. Here, a distribution of sulfur 32 in grain 34 and grain boundaries 36 is present during annealing in accordance with the present disclosure. The addition of sulfur promotes surface-energy-induced selective growth of {110} grains to that of {100} grain by the interfacial segregation of sulfur as shown by arrows 40. Segregation of sulfur in the free surface and grain boundaries after annealing results in a surface energy where: $\lambda 100 < \lambda 110$ or $\lambda 111$. Thus, there is an increase in the number of crystals having a cube texture and the sample is more uniform than the starting sample shown in FIG. 3(a).

Other addition elements may be used in amounts sufficient to control grain boundary separation. For example, addition elements may be added which improve ductility of Fe—Ga compositions, e.g., due to suppression of grain boundary fracture. Suitable supplementary addition elements include such elements as aluminum, beryllium, boron, cesium, carbon, chromium, cobalt, copper, germanium, hafnium, iridium, lead, manganese, molybdenum, nickel, niobium, nitrogen, oxygen, phosphorus, platinum, rhenium, rhodium, ruthenium, silicon, sulfur, tantalum, thorium, titanium, vanadium, zirconium, and combinations of these elements. In embodiments, such addition elements may be contained in the alloy in an amount from about 0.001% to about 3.00 atomic % of the total composition.

Figure 4:
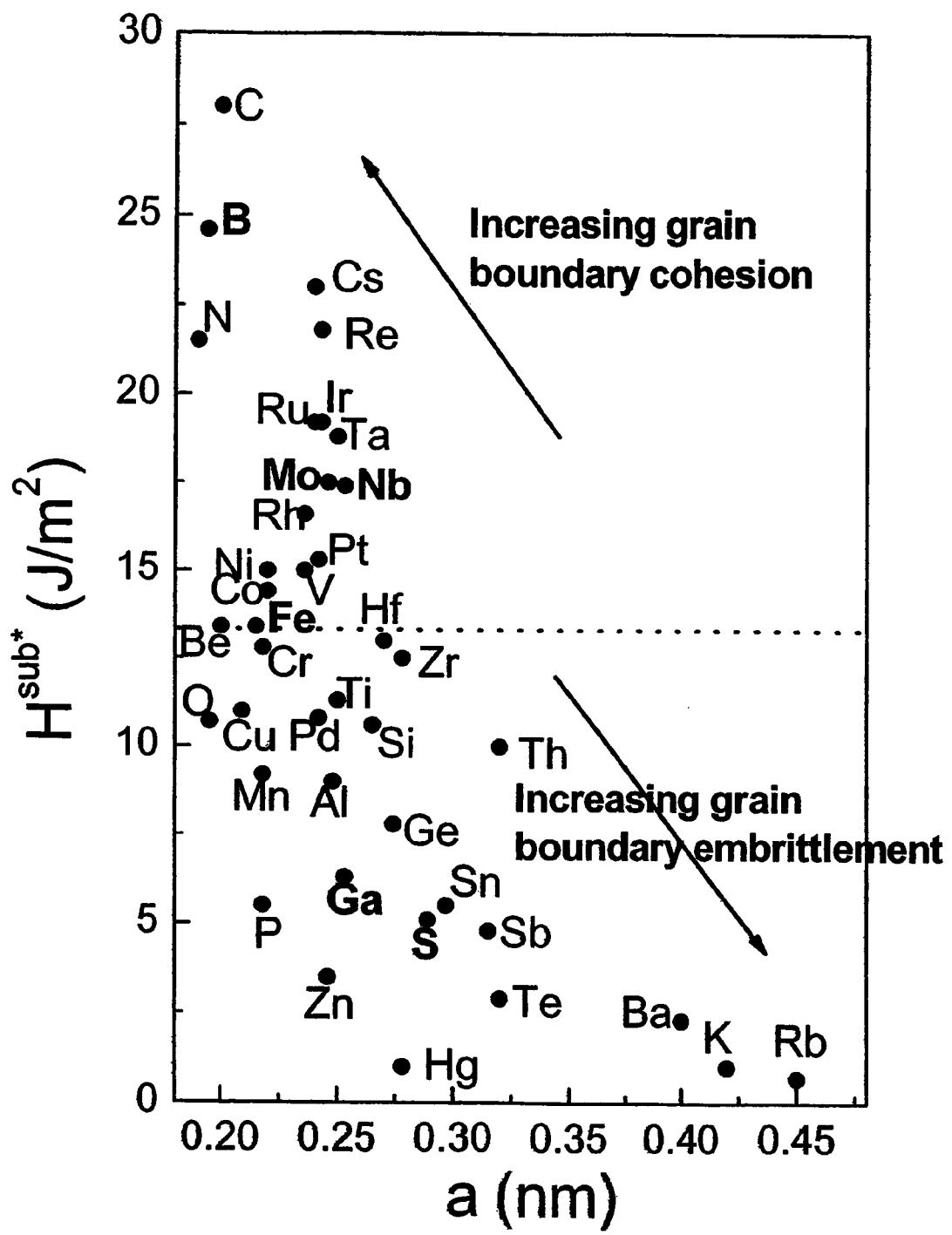
FIG. 4 is a plot showing a distribution of elements based on sublimation enthalpy and atom size.

Referring now to FIG. 4, a plot shows a distribution of various elements based on the sublimation enthalpy and atom size of the element. As sublimation enthalpy increases, and atomic size decreases, the elements generally become more suitable for use as additions for increasing grain boundary cohesion in Fe—Ga alloys. Those elements having comparatively low sublimation enthalpy, and large atomic size tend to be less suitable for use as additions for they tend to increase grain boundary embrittlement. Accordingly, in embodiments, non-limiting examples of elements such as B, Mo and Nb as shown in FIG. 4 are suitable for use as additions in accordance with the present disclosure.

Fe—Ga alloys suitable for use in accordance with embodiments of the present disclosure may have boron content to control grain boundary separation. In embodiments, suitable boron content is from about 0.001% to about 3.00 atomic % of the total composition.

Suitable polycrystalline Fe—Ga compositions for use in accordance with the present disclosure include those alloys having the general formula (Fe—X at. % Ga)+(0.001-3%) at. % R, where X is a number for atomic percent of gallium between 10 and 40, and R is the atomic % for one or more addition elements. Fe makes up the balance of the composition. R may be one or more addition elements. Non-limiting examples of suitable addition elements include: aluminum, beryllium, boron, cesium, carbon, chromium, cobalt, copper, germanium, hafnium, iridium, lead, manganese, molybdenum, nickel, niobium, nitrogen, oxygen, phosphorus, platinum, rhenium, rhodium, ruthenium, silicon, sulfur, tantalum, thorium, titanium, vanadium, zirconium, and combinations thereof. Accordingly, non-limiting examples of suitable alloy compositions in accordance with the present disclosure include: (Fe-17 at. % Ga)+0.2 at. % Mo; (Fe-18.7 at. % Ga)+0.5 at. % B; (Fe-18.7 at. % Ga)+0.5 at. % B+0.005 at. % S; (Fe-18.7 at. % Ga)+1 at. % B+0.05 at. % S; (Fe-18.7 at. % Ga)+1.0 at. % B; and (Fe-18.7 at. % Ga)+2 at. % Mo.

The Fe—Ga alloys according to the present disclosure may be made by following a series of progressive manufacturing steps that convert Fe—Ga alloy of varying texture or crystal orientation to a polycrystalline material having an increasingly uniform crystal orientation such as the {100}<001> orientation or cube texture. By following a series of manufacturing steps, a production of a high tensile strength rolled Fe—Ga sheet having excellent strain age hardening characteristics with the tensile strength of about 500 MPa or more and the yield ratio of about 2% or above. The production is characterized in that sequentially carried out are: a hot rolling step in which a Fe—Ga slab having a composition containing, by atomic %, having the general formula (Fe—X at. % Ga)+ (0.001-3.0) at. % R is sealed in a stainless steel container and heated at a temperature between 700-1000° C. However, in embodiments, the use of a can may be avoided by using a lower temperature, such as about 800° C. Next, the sheet is reheated to about a 1000° C. after every pass of the hot roller for 10 minutes. Next the specimen is subjected to warm rolling at 350° C. to 400° C. to give a sheet further reduced in thickness. Immediately, the specimen is subjected to a warm rolled sheet annealing step in which the warm rolled sheet is annealed at a temperature between the recrystallization temperature and 800° C. for the holding time 2 hours under inert atmosphere to relieve the internal stress. After the stress relief annealing step, cold rolling can be undertaken until the desired thickness is achieved. One or more subsequent annealing steps are conducted under various temperatures above 600° C. for time periods between 0.5-24 hours or longer and under vacuum and inert atmosphere of argon.

Figure 5A:
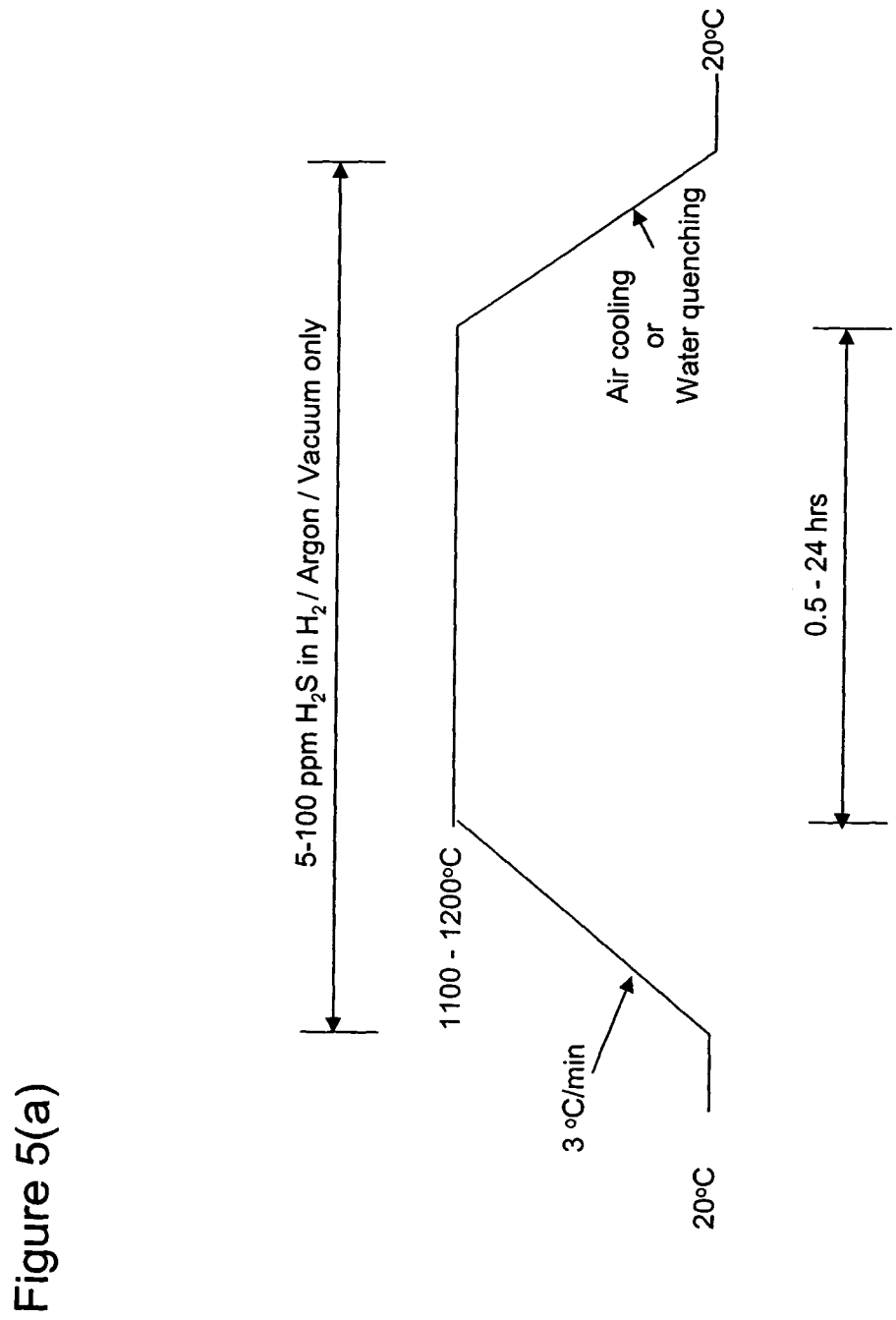
FIG. 5(a) shows a first temperature profile suitable for annealing Fe—Ga alloy.
Figure 5B:
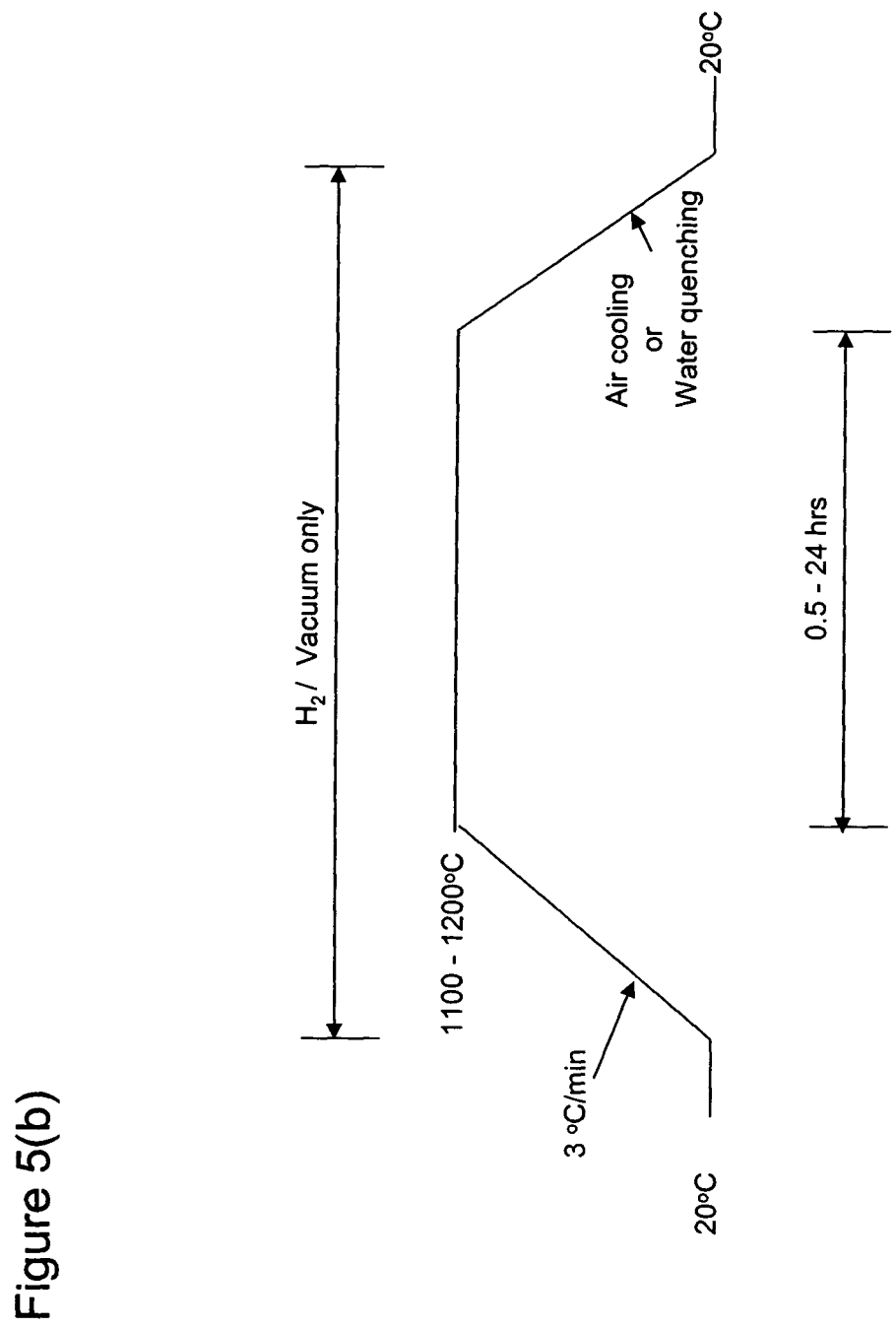
FIG. 5(b) shows a second temperature profile suitable for annealing Fe—Ga alloy.

In embodiments, the subsequent annealing step can help achieve saturation magnetostriction potential of 100 ppm and above. This is because the grains of as-rolled Fe—Ga sheets have been deformed and have not recrystallized to stress-free grains. Accordingly, an elevated temperature for a pre-selected period of time (such as longer than 0.5 hours) can recrystallize the grains of as-rolled sheets. A non-limiting example of a temperature suitable to anneal the grain of as-rolled sheets includes a temperature over 600° C. In embodiments, the annealing temperature may also be set between 1100° C. -1200° C. Multiple anneals at various temperature and times are also possible. One non-limiting example of conditions for a double anneal is 1000° C. for 6 hours and 1200° C. for one hour followed by water quenching. Other temperature profiles for annealing the as-rolled sheets showing environment, temperature changes, and duration are shown in FIG. 5 (*a*) and FIG. 5(*b*). Referring to FIG. 5(*a*), the temperature is controlled and adjusted over a period of time between 0.5 and 24 hours. The atmosphere can be adjusted to include $H_2$ gas, argon, while maintaining the sample under vacuum. Moreover, $H_2S$ gas can be added during the subsequent annealing step to introduce additional sulfur to promote surface-energy-induced selective growth of {110} grain to that of {100} grain by the interfacial segregation of sulfur. The temperature is maintained between temperatures such as 1100° C.-1200° C. for most of the annealing process, then dropped for a slow cool down. Ultimately, the sample is air or water cooled to 20° C. Referring now to FIG. 5(*b*), a similar temperature profile for the annealing step is shown to that of FIG. 5(*a*), except that argon and $H_2S$ is not present in the atmosphere. As sulfur is not being added in the annealing step, it can be desirable to pre-select a Fe—Ga composition having higher sulfur content when using this temperature profile.

Figure 6A:
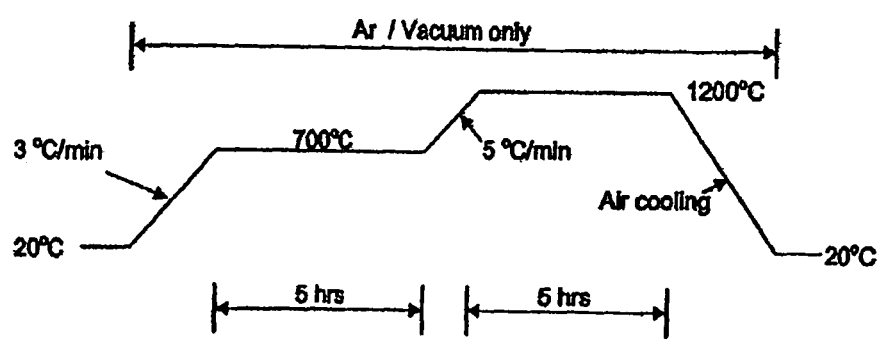
FIG. 6(a) shows a first temperature profile suitable for an annealing step during powder metallurgy texturing of Fe—Ga alloy.
Figure 6B:
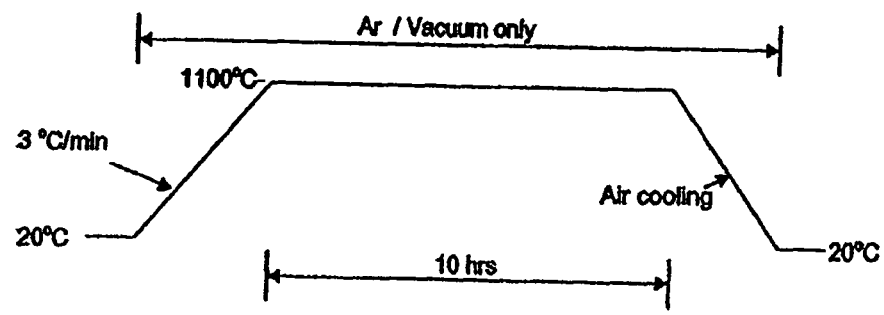
FIG. 6(b) shows a second temperature profile suitable for annealing step during powder metallurgy texturing of Fe—Ga alloy.

Although the rolling manufacturing process is one way of texturing Fe—Ga in accordance with the present disclosure, other suitable techniques for selective texturing include: powder metallurgy, directionally solidified, extrusion, forging, electro deposition, sputtering, and melt spinning. For example, powder metallurgy could be carried out by subjecting a designed alloy to a heat treatment where the alloy is normalized and subjected to a high temperature anneal for recrystallization. Suitable heat treatments are shown in FIG. 6(*a*) and FIG. 6(*b*). Following the heat treatment step, the alloy is subjected to wet high energy ball mill, using a miller such as SPEX MILL and alcohol solvent. Next, the alloy is dried in an oven at a temperature of between 70-80° C. Fe—Ga powder is further mixed with metal powders such as copper and aluminum and milled to make a mixture. The mixture is subjected to a hot press, followed by a stress relief anneal at 450° C. for 3 hours.

The following examples are given for the purpose of illustrating the present disclosure and are not intended to limit the scope in any way.

Example 1

Pre-Treating Fe—Ga Composition $Fe_{81.3}Ga_{18.7}$+0.5 at. % boron+0.005 at. % sulfur (Alloy A) and ($Fe_{81.3}Ga_{18.7}$)+1.0 at. % boron+0.05 at. % sulfur (Alloy B) buttons, having about 50 gram in weight, were prepared by arc-melting system. The ingots were remelted several times to assure homogeneity. The starting buttons were enclosed in a 321 stainless steel can, and sealed by welding to prevent oxidation of the specimen. To minimize diffusion bonding of the Fe—Ga specimens within the can during rolling, the cans were preoxidized at 1000° C. in air for 1 hour.

Rolling and Annealing Steps

Following hot soaking at 1000° C. for 1 hour, the canned specimens were hot rolled to give a 65% reduction to a thickness of 2.4 mm over 82 passes. Throughout the hot rolling step, the canned specimens were reheated at 1000° C. after every one pass for 10 minutes. Next the specimens were subjected to warm rolling at 350° C. or 400° C. providing an 83% reduction over 53 passes to give a sheet 0.4-mm thick. The sheets were annealed at 800° C. for 2 hours under argon to relieve the internal stress. After the stress relief annealing step, cold rolling was undertaken over 18 passes until the thickness of 0.30~0.35 mm was achieved for as-rolled sheets. Next, some of the as-rolled sheets were subjected to a subsequent annealing conducted under various temperatures between 600-1200° C. for time periods of 0.5-24 hours and under inert atmosphere of flowing argon. The subsequent anneals are further described below.

The microstructures of the samples were examined using scanning electron microscopy (SEM) with wave-length dispersive x-ray spectrometry (WDS) to assess the grain and the compositions. Pole figure measurements were carried out using SEM (Zeiss EVO 50). A section of each sample was scanned with a step size of 10 µm across a selected surface area of 460 µm×380 µm for as-rolled sample and 4 mm×4 mm for an annealed sample. Electron backscattering diffraction (EBSD)'s patterns and images were obtained at an accelerating voltage of 20 kV. The EBSD (HKL Tech.—Nordlys II) formed on a large phosphor screen (38 mm×28 mm) were captured and analyzed using OIM data collection software to obtain pole figures, grain boundary image, texture component map, recrystallized fraction map, and orientation distribution function plots. The saturation magnetostriction of Fe—Ga sheets were measured using the directionally applied magnetic field method by Nd—Fe—B permanent magnets. The square shaped sheet was put on the center between the permanent magnets with 1.5 inch gap, generating the magnetic field of 3.5 kGauss. The strain gauged specimen was rotating from parallel to perpendicular orientation to the RD using stepping motor. The strain response follows a cosine squared function with the peak to peak value for $(3/2)\lambda_S=\lambda_{\parallel}-\lambda_{\perp}$.

Magnetostriction of as-Rolled and Annealed Sheets

Figure 7:
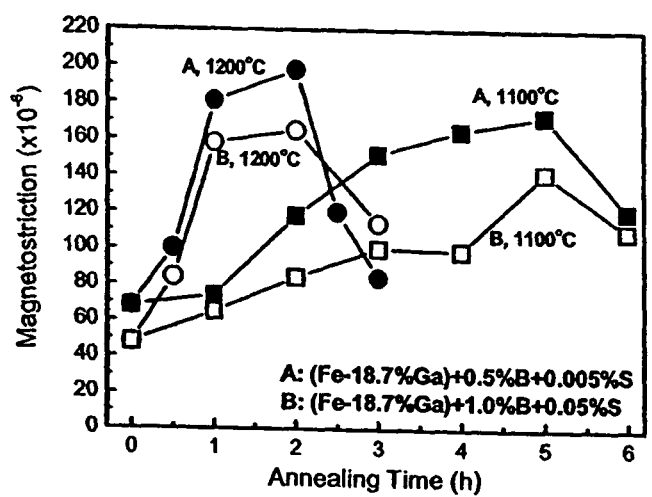
FIG. 7 shows a polar plot of magnetostriction as a function of annealing time in Fe—Ga compositions in accordance with the present disclosure annealed at 1100° C. and 1200° C.

The as-rolled sheets were cut in squared shape with 12 mm×12 mm×0.3 mm and were subsequently annealed at various conditions. FIG. 7 is a plot showing magnetostriction as a function of annealing time in the $(Fe_{81.3}Ga_{18.7})+0.5$ at. % B+0.005 at. % S (Alloy A) and $(Fe_{81.3}Ga_{18.7})+1.0$ at. % B+0.05 at. % S (Alloy B) sheets annealed at 1100° C. and 1200° C., respectively. Both alloy A and alloy B were carried out under flowing argon during annealing, and then quenched in water. The magnetostriction of as-rolled sheets in both alloys is lower than that of annealed sheets, because the grains of as-rolled sheets with the average grain size of 40 μm have been deformed and not yet recrystallized to stress-free grains. In the case of alloy A with a lower amount of sulfur, the magnitude of magnetostriction increases with an increase of annealing time, reaches peak values of 173 ppm and 198 ppm at annealing temperature of 1100° C. and 1200° C., respectively. When compared to sulfur-free sheets with a maximum value of 103 ppm, the sample annealed at 1200° C. for 2 h has almost double in magnetostriction. It was also observed by Auger Electron Spectroscopy that the derivative sulfur peak of this annealed sample was moved into nearest surface and the magnitude was somewhat higher after anneal. This is, therefore, considered due to the formation of {100}<001> or {110}<001> texture through surface-energy-induced selective grain growth controlled by segregated sulfur on the surface. For the larger amount of sulfur (alloy B), similar trends with smaller peak strain values, as much as 83% of alloy A's peak at each temperature, were observed. As the annealing temperature increases, the observed peaks on the convex profiles shifted to less annealing time of 2 hours and also narrowed for each alloy.

Figure 8A:
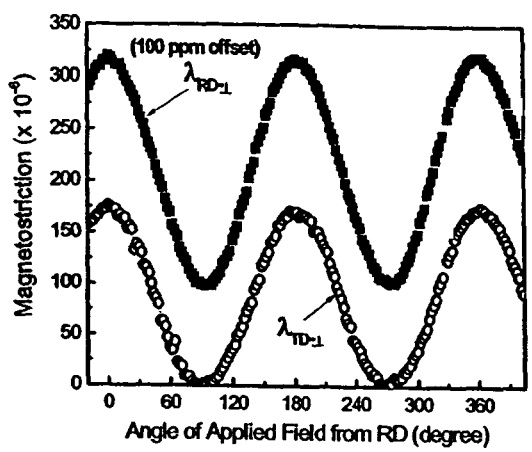
FIG. 8(a) shows a plot of magnetostriction in relation to angle of applied magnetic field for compositions in accordance with the present disclosure.
Figure 8B:
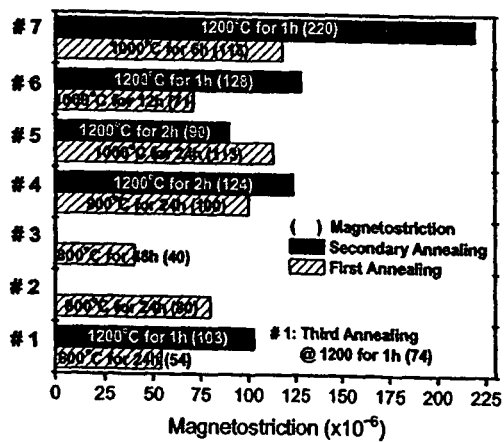
FIG. 8(b) shows magnetostriction of Fe/Ga alloys annealed under different conditions.

Referring now to FIG. 8(a), a plot shows magnetostriction as a function of rotating angle of applied field from rolling direction. Alloy A, which was double annealed at 1000° C. for 6 hours and 1200° C. for 1 hour then quenched in water for each annealing, exhibits the maximum magnetostriction of 220 ppm from rolling direction ($\lambda_{RD-\parallel}$) and of 175 ppm from transverse direction ($\lambda_{TD-\perp}$). The strain response from an orientation parallel to the rolling direction follows a cosine squared function with peak to peak value. Firstly, the temperature annealing below 1000° C. for up to 48 hours was carried out under flowing argon. The magnetostriction slightly increased with increasing annealing temperature for 24 hours, however, the annealed sheets above 1100° C. for long time were broken along grain boundaries during quenching even though some selective grain growth of {100}<001> grains was formed. After secondary annealing at 1200° C. for 1~2 hours, the magnetostriction was mostly enhanced as much as 1.24-1.9 times. (FIG. 8(b) shows magnetostriction results for multiple anneals of alloy A). Here, temperature rather than time is believed to be a driving force for grain growth. For example, the annealed sample at 1200° C. for 2 hours had a large average grain size of 282 μm than that at 1100° C. for 4 hours with the size of 195 μm at the same composition of $(Fe_{81.3}Ga_{18.7})+0.5$ at. % B+0.005 at. % S, and the deformed/sub-structured area went from 44%, as-rolled, down to 20% for 1100° C. and to below 1% for 1200° C. Even though annealing temperature was 100° C. higher, it was effectively achieved for magnetostriction and selective grain growth to be enhanced through secondary recrystallization.

Figure 9A:
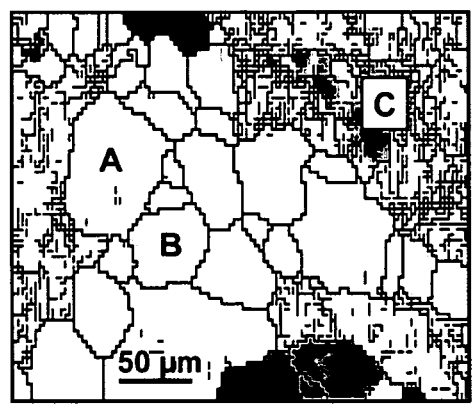
FIG. 9(a) shows a texture component map of as-rolled Fe—Ga sheet.
Figure 9B:
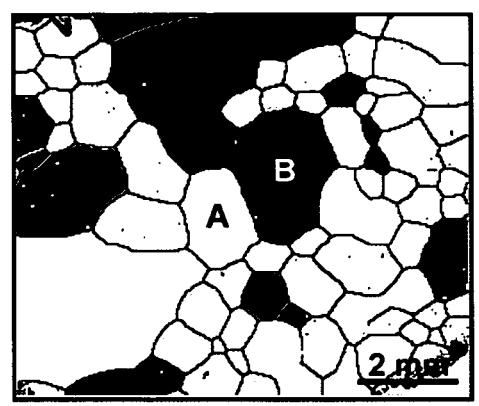
FIG. 9(b) shows a texture component maps on double annealed Fe—Ga sheet in accordance with the present disclosure with magnetostriction of 220 ppm.
Figure 10A:
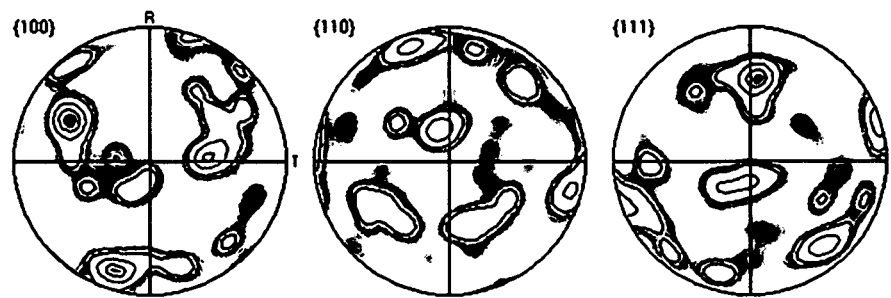
FIG. 10(a) shows pole figures of as rolled sheets of ($Fe_{81.3}Ga_{18.7}$)+0.5 at. % B+0.005 at. % S in <100>, <110>, and <111> orientation.
Figure 10B:
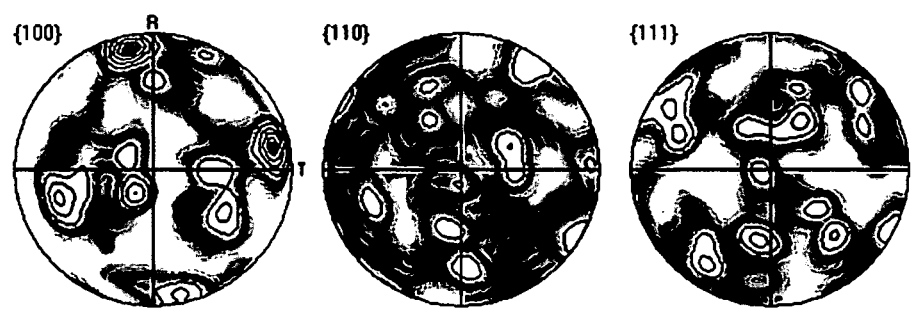
FIG. 10(b) shows pole figures of double annealed sheets of ($Fe_{81.3}Ga_{18.7}$)+0.5 at. % B+0.005 at. % S in <100>, <110>, and <111> orientation.

In order to examine the texture, the EBSD was analyzed and pole figures, texture component map, and orientation distribution function plots were obtained in detail. FIG. 9(a) shows texture component maps on as-rolled sheet with stress relief anneal at 600° C. for 2 hours in air. FIG. 9(b) shows texture component maps on sample double annealed at 1000° C. for 6 hours and 1200° C. for 1 hour then quenched in water for each annealing. In FIG. 9(a) and FIG. 9(b), the color of the boundaries indicates the misorientation angle range with gray lines, e.g. those mostly being included in area "C", means a 2°~4.9° misorientation of the sub-grain boundary, and black lines of above 10° stand for typical grain boundaries. Here, the image of as-rolled sample in FIG. 9(a) shows areas/grains with sub-grain boundaries, while there are significantly less sub-grain boundaries in the case of double annealed one as shown in FIG. 9(b). These areas/grains had been deformed by rolling process and not yet recrystallized. The average grain size of as-rolled sheet with approximately 40 μm was significantly smaller than that of double annealed one with 844 μm. When compared to 14% of the {100}<001> oriented area of as-rolled sheet for fully scanned area, the area of double annealed sample increased up to 45.3% for the grain area having {100}<001> parallel to the rolling direction within 20°. Where white grain "A" is 20° off-grain from the {100}<001> orientation, and the darker grains "B" have more oriented {100}<001> direction. Referring now to FIG. 10, pole figures are shown corresponding to the texture maps, and present the distribution of a specific crystal direction relative to the rolling direction in a stereographic projection. The {100}, {110}, and {111} pole figures using tour map show the distribution of {100}<001>, {110}<001>, and {111}<211> direction of grains, respectively, with respect to the rolling direction (R) and transverse direction (T) of the specimen. The pole figure of as-rolled sheet shows some {100}<001> and {111}<211> clustering with very low strength, while that of double annealed sample does only stronger {100}<001> clustering closer to the rolling direction. Confirmation of the texture assessments was done using orientation distribution function (ODF).

Figure 11A:
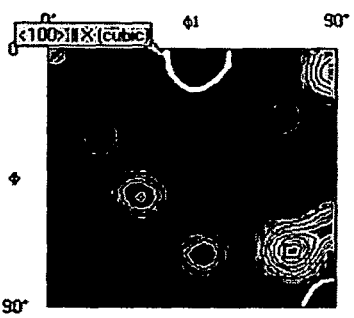
FIG. 11(a) is an orientation distribution function plot of ($Fe_{81.3}Ga_{18.7}$)+0.5 at. % B+0.005 at. % S as rolled with 68 ppm.
Figure 11B:
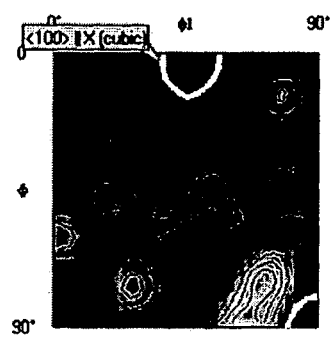
FIG. 11(b) is an orientation distribution function plot of ($Fe_{81.3}Ga_{18.7}$)+0.5 at. % B+0.005 at. % S single annealed sheet at 1100° C. for 4 h with 165 ppm.
Figure 11C:
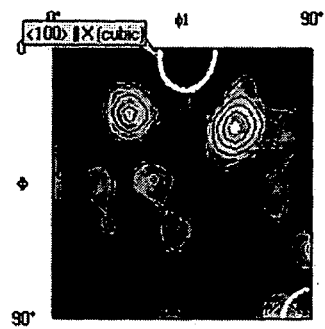
FIG. 11(c) is an orientation distribution function plot of ($Fe_{81.3}Ga_{18.7}$)+0.5 at. % B+0.005 at. % S single annealed sheet at 1200° C. for 2 h with 198 ppm.
Figure 11D:
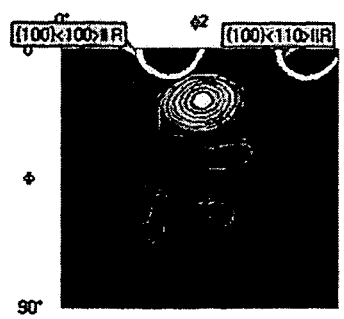
FIG. 11(d) is an orientation distribution function plot of ($Fe_{81.3}Ga_{18.7}$)+0.5 at. % B+0.005 at. % S double annealed sheet with 220 ppm.

Referring now to FIG. 11 ODF plots are shown of the cross-section ($\phi 2=45°$, typical choice for cross-section cut) on $(Fe_{81.3}Ga_{18.7})+0.5$ at. % B+0.005 at. % S sheets as-rolled (FIG. 11(a)), single annealed at 1100° C. for 4 h (FIG. 11(b)), single annealed at 1200° C. for 2 h (FIG. 11(c)), and double annealed(FIG. 11(d)), respectively. Ideal texture of {100}<001> is located in white line of uppercenter, while the {100}<001> texture in upper right corner for the double annealed sheet. And the {110}<001> texture corresponds to the line of lower right corner. ODF plot corresponding to as-rolled sample shows {hkl}<110> type texture with a stronger near {111}<110> and a weaker {110}<001>. Both the partial textures corresponding to α-fiber texture often observed in rolled bcc metals. After texture annealing at 1100° C., the main texture shown in figure FIG. 11(b) was changed to near {110}<001> texture. As the magnetostriction increased, the texture shown in FIG. 11(c) and FIG. 11(d)) was almost approached to {100}<001> texture, and that of the double annealed sheet with the maximum value of 220 ppm was changed from a strong as-rolled {hkl}<110> texture to a strong texture close to {100}<001>.

Observations

The selective development of {100}<001> cube texture in polycrystalline $(Fe_{81.3}Ga_{18.7})+0.5$ at. % boron+0.005 at. % sulfur and $(Fe_{81.3}Ga_{18.7})+1.0$ at. % boron+0.05 at. % sulfur alloys was examined using a rolling and annealing processes. The texture of as-rolled $(Fe_{81.3}Ga_{18.7})+0.5$ at. % B+0.005 at. % S sheet was {hkl}{100}<001> texture corresponding to α-fiber texture. The near {100}<001> was formed in the annealed sheet at 1200° C. for 2 hours, while the texture of annealed sheet at 1100° C. for 4 hours was close to goss texture {110}<001>. The maximum magnetostriction of 220 ppm was obtained at the double annealed sheet at 1000° C. for 6 hours and 1200° C. for 1 hour. And the texture was closer and stronger to the ideal cube texture {100}<001> than the less desirable {110}<001>.

Example 2

Figure 12:
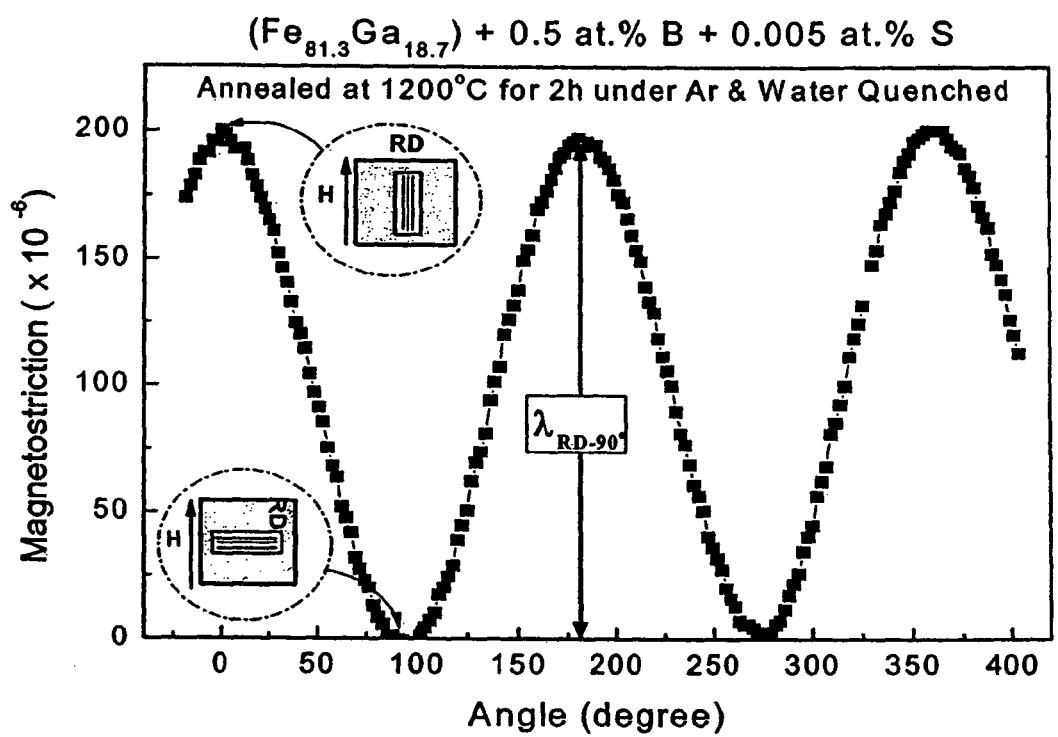
FIG. 12 shows a plot of magnetostriction in relation to angle of applied magnetic field for compositions in accordance with the present disclosure.
Figure 13:
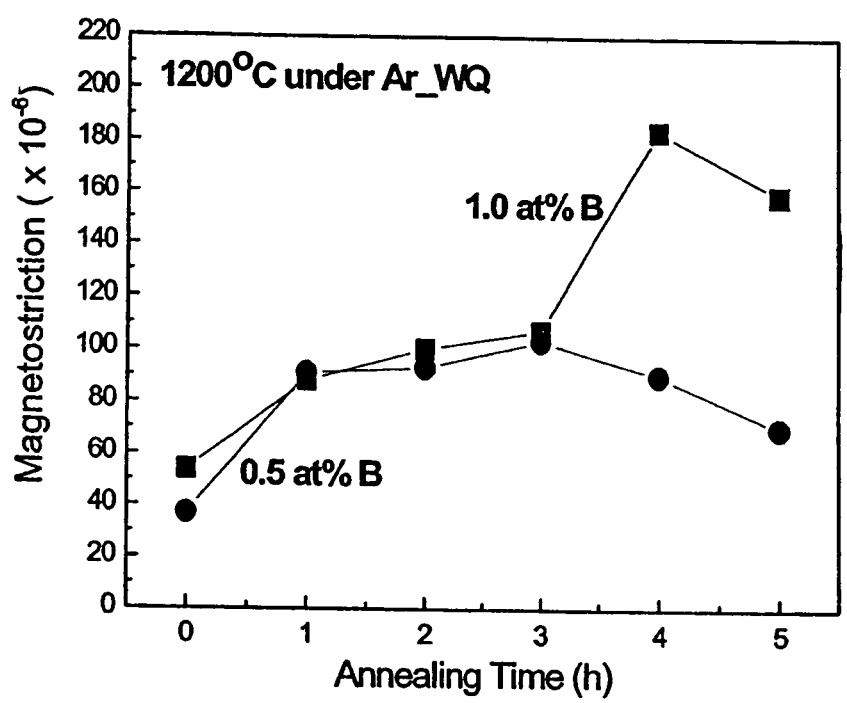
FIG. 13 shows a polar plot of magnetostriction as a function of annealing time in Fe—Ga compositions in accordance with the present disclosure annealed at 1200° C.
Figure 14:
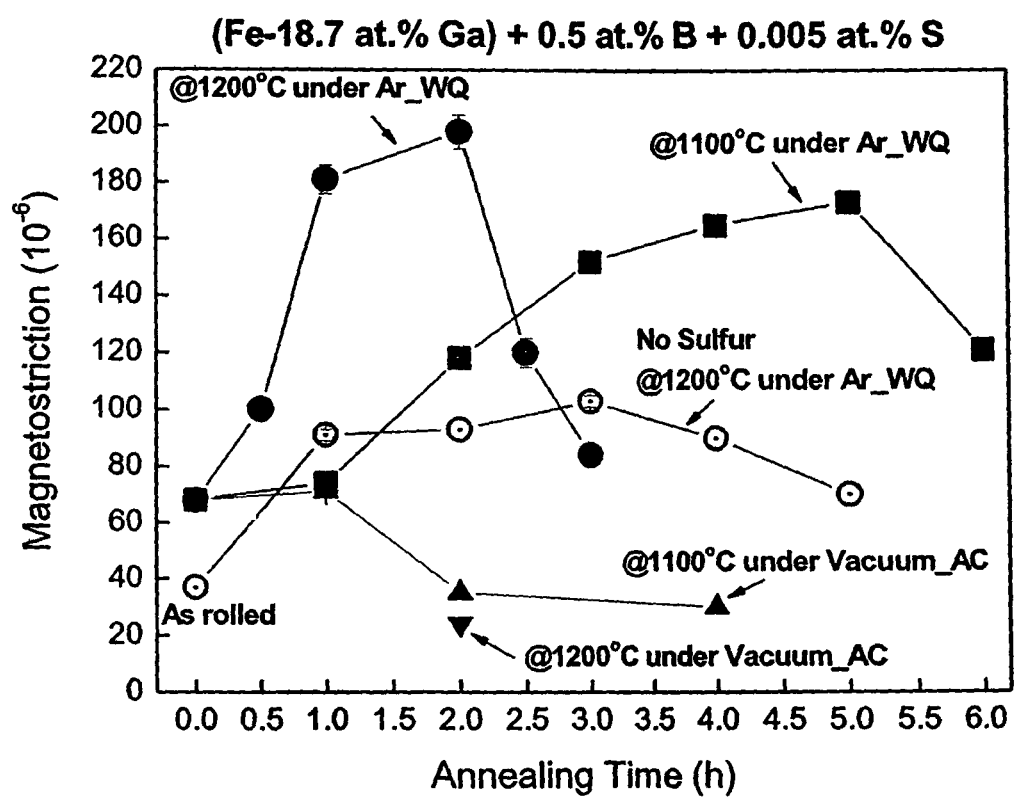
FIG. 14 shows a polar plot of magnetostriction as a function of annealing time in Fe—Ga compositions in accordance with the present disclosure annealed at various annealing temperatures and atmospheres.
Figure 15:
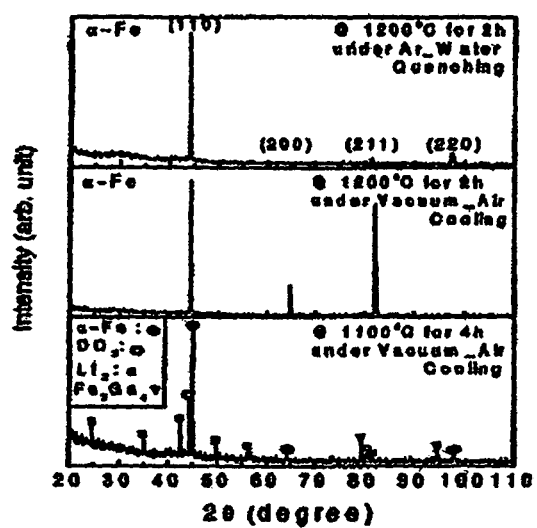
FIG. 15 shows an X-Ray diffraction pattern of Fe—Ga compositions in accordance with the present disclosure annealed at various annealing conditions.

Polycrystalline $Fe_{81.3}Ga_{18.7}$ plus boron (0.5/1.0 at. %) and sulfur (0.005 at. %) buttons prepared by arc-melting are modified. Specimens with a final thickness of 0.30 mm were produced by hot, warm, and cold rolling. The starting button was enclosed in a 321 stainless steel can, sealed by welding to prevent oxidation of the specimen. The canned specimen was hot rolled to give a 65% reduction to a thickness of 2.4 mm over 82 passes at 1000° C. And warm rolling at 350/400° C. provided an 83% reduction over 53 passes to give a sheet 0.4 mm thick. A stress relief annealing step was completed, followed by cold rolling until a thickness of 0.30 mm in order to develop stronger cube texture in the {100}<001> orientation in the rolling direction. A subsequent annealing step was conducted under various temperatures of 1100-1200° C. for 0.5-6 hours and various atmospheres such as argon, sodium silicate and vacuum. The magnetostriction of rolled and annealed Fe—Ga doped with boron and sulfur was observed. Thin sheets of boron and sulfur doper Fe-18.7 at % Ga were successfully fabricated using the rolling process, where boron improves ductility due to suppressing grain boundary fracture and sulfur assists the formation of selective grain growth controlled by surface-energy-induced recrystallization. The recrystallized sheets exhibit a maximum magnetostriction of 200 ppm along the rolling direction. The strain response followed a cosine squared function with the peak to peak value shown in FIG. 12. The results of magnetostriction as a function of annealing time are also shown in FIG. 13 and FIG. 14 respectively additive boron and boron plus sulfur effects. Non-limiting examples demonstrate that magnetostriction of greater than 100 ppm is obtained. Referring now to FIG. 15 an X-ray diffraction pattern of (Fe-18.7 at. % Ga)+0.5 at. % B+0.005 at. % S is shown under various annealing conditions. The crystallographic plain corresponding to a peak value for the sample annealed at 1200° C. for 2 hours under argon atmosphere shows an increase in the 200 plane.

Example 3

Fe-18.7% Ga alloy buttons plus 0.5 and 1.0 at. % B, were pre-selected and prepared by arc-melting system. The ingots, each with a mass of ~50 grams were remelted several times to assure homogeneity. The starting button was enclosed in a 321 stainless steel can, sealed by welding to prevent oxidation of the specimen. In order to minimize diffusion bonding between the Fe—Ga specimen and the can during rolling, the can was preoxidized at 1000° C. in air for 1 h. Following heating at 1000° C. for 1 hour, the canned specimen was hot rolled to give a 65% reduction to a thickness of 2.4 mm over 82 passes (reheated at 1000° C. after every pass for 10 minutes). Subsequent warm rolling at 350 or 400° C. provided an 83% reduction over 53 passes to give a sheet 0.4-mm thick. This sheet was annealed at 800° C. for 2 hours under argon to relieve the internal stress. After the stress relief anneal, cold rolling were undertaken over 18 passes until the thickness of 0.35 mm. A subsequent annealing at 1200° C. with various annealing time was conducted under flowing argon and then quenched in water. The microstructure was examined using high resolution (HR) x-ray diffraction and the fracture surfaces were examined in a scanning electron microscope (SEM). Auger electron spectroscopy (AES) was utilized to study the segregation of B in the grain boundary. The saturation magnetostriction of Fe—Ga sheets were measured using the directionally applied magnetic field method by Nd—Fe—B permanent magnets that produced a magnetic field of 3.5 kGauss in air. The strain-gauged square shaped sheet specimens were centered in the 38-mm gap between the permanent magnets and rotated to obtain magnetostriction parallel and perpendicular to the rolling direction using stepping motor. The strain response follows a cosine squared function with the peak to peak value for $(3/2)\lambda_s = \lambda_\parallel - \lambda_\perp$. The magnetic properties were measured by vibration sample magnetometer (VSM).

In order to enhance ductility, boron with 0.5-1.0% was introduced to Fe—Ga alloy, where small addition of B accelerated the migration of thermal vacancies and suppressed propensity to grain boundary fracture. Eventually, the thin sheets of Fe-18.7% Ga plus 0.5 and 1.0% B, respectively, were successfully fabricated with thickness of 0.35 mm using rolling processes.

Figure 16A:
FIG. 16(a) shows an Fe—Ga composition free of boron with an intergranular fracture mode and crack propagation along grain boundaries under scanning electron microscope.
Figure 16B:
FIG. 16(b) shows an Fe—Ga composition having 0.5% boron shown under scanning electron microscope.
Figure 16C:
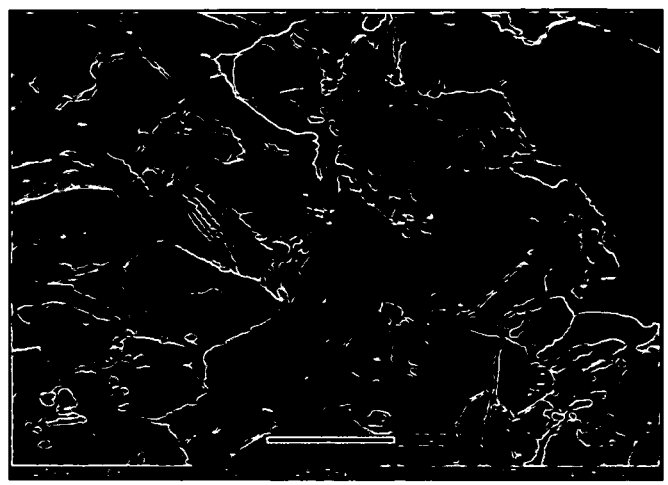
FIG. 16(c) is an enlargement of a portion of an area of FIG. 16(b).
Figure 16D:
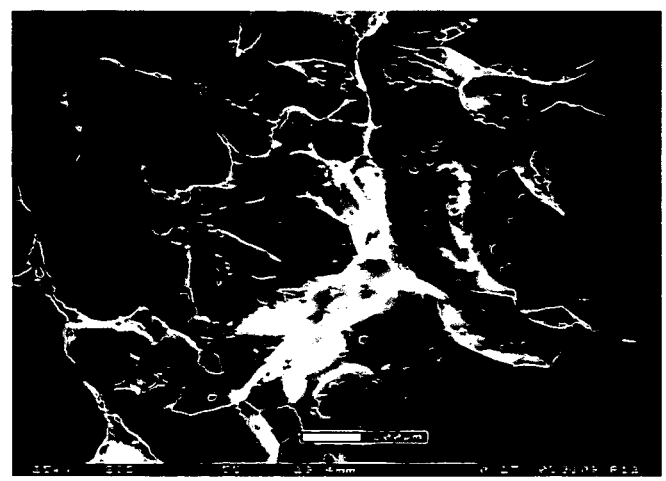
FIGS. 16(d), 16(e), and 16(f) show Fe—Ga composition+1% boron under scanning electron microscope.
Figure 16:
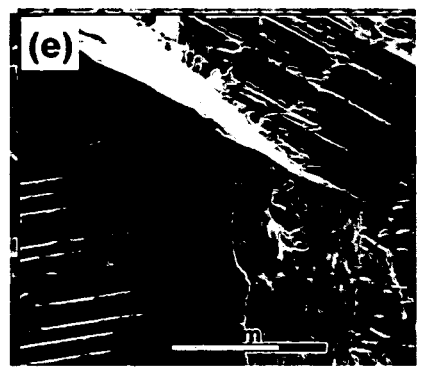
Figure 16F:
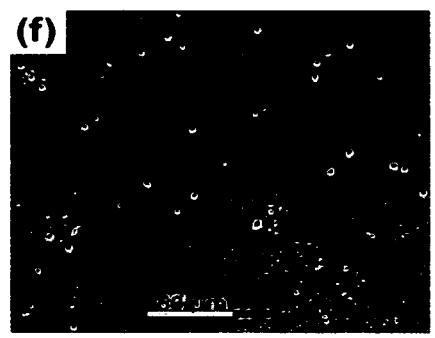

Referring now to FIGS. 16(a), 16(b), 16(c), 16(d), 16(e) and 16(f) SEM fractographs and microstructure of boron-free and boron-added Fe-18.7% Ga alloys are shown. FIG. 16(a) shows the B-free alloy, with average grain size of about 400 μm, exhibiting intergranular fracture with smooth facets, indicating severe ductility deterioration. Referring now to FIG. 16(b) the 0.5% B-added alloy not only changed to a transgranular fracture mode with cleavage, but also exhibited well refined structure with grain sizes of below 100 μm. It is believed that boron had a great effect on improvement of ductility in Fe—Ga alloy due to both a strong tendency to segregate to the grain boundaries and its effect on grain refinement. Comparison of FIG. 16(c) and FIG. 16(e) fractographs shows similarities in the fracture mode of the 1.0% B-added alloy and the 0.5% B-added alloy, and that holes and traces of Fe$_2$B precipitates, which are mechanically harder than the α-iron matrix, are also observed in both. FIG. 16(f) clearly shows that the holes with the diameter of 2~4 μm are distributed in the grains and grain boundaries. The presence of a Fe$_2$B second phase in small amount was confirmed by HR x-ray diffraction analysis, where the peaks were mainly searched at 2θ angle of 24.616, 50.460, and 79.464 degrees.

Figure 17:
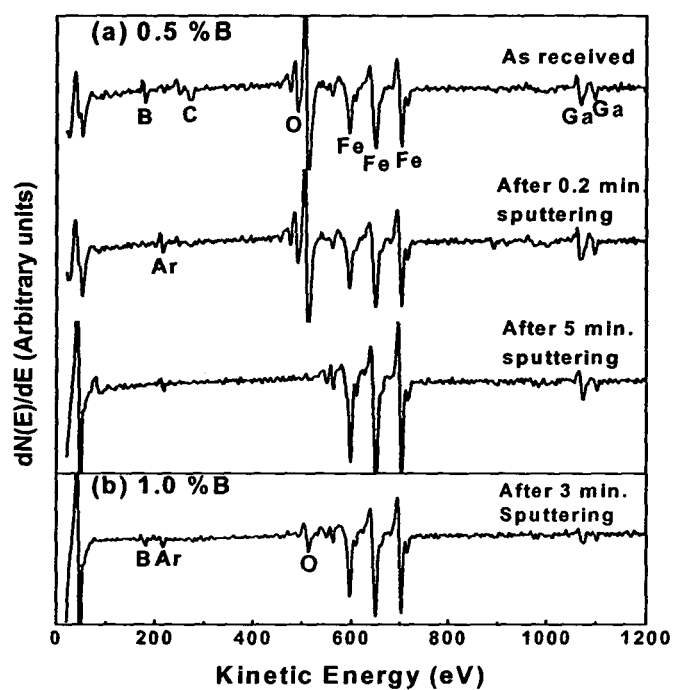
FIG. 17 shows a plot Auger spectra obtained from a fracture surface with various sputtering times in Boron added alloys.

Auger analysis was used to study the fracture surface chemistry. FIG. 17 shows typical Auger spectra obtained from the fracture surface with various sputtering times in the B-added alloys. Besides the Fe, Ga and B peaks, small C, Ar and various O peaks also appear in the spectra. Since strong O and weak C peaks, in the case of 0.5% B-added alloy button, are present prior to ion-sputtering, it is assumed that they were the results of contamination after fracture in the air. Since Ar was used as sputtering gas, the small Ar peak is present during sputtering. The B peak is clearly visible on the fracture surface corresponding to grains and grain boundaries. After 5 min. sputtering, B as well as C and O are almost removed from the fracture surface. Also the concentration of B is 0.93 at. %, corresponding to double of the purposed one, after 3 min. sputtering (see Table I). It is considered that B atoms are segregated at the grain boundary in atomic scale. The B peak in the 1.0% B-added alloy is still present after 3 min. sputtering.

Therefore, the B atoms are distributed not only within the grains, but also in the grain boundaries by its segregation. After annealing, thermal oxidation occurred at the surface and interfacial segregation of B between the surface and atmosphere was simultaneously generated due to high temperature diffusion. The Ga atoms also diffused and segregated to the surface (evident in Table I). The concentration of Ga increases up to 34.38% at the oxide surface, and unexpectedly exhibited slightly higher than the targeted 18.7% Ga in the mother alloy (e.g. 21.51% Ga) after removal of oxide by the ion-sputtering.

The as-rolled sheets were cut in squared shapes with dimensions of 12 mm×12 mm×0.35 mm. The texture annealing at 1200° C. was conducted under flowing Ar and then samples were quenched in water. FIGS. 18(a) and 18(b) show magnetic and magnetostrictive properties as a function of annealing time in B-added alloy sheets, respectively. The saturation magnetization ($M_S$), corresponding to 6.87 emu/g, was almost unchanged, but the coercivity ($H_C$) decreased from 48 to 14 Oe in the 1.0% B-added sheet after annealing. This is explained by considering that residual stresses and defects in the as-rolled sheet are relieved and removed during annealing, and grain boundaries are reduced due to recrystallization and grain growth. Similar trends on $M_S$ and $H_C$ were observed in the 0.5% B-added sheet. The magnetostriction of the as-rolled sheets is also very low. Sheets annealed at 1200° C. exhibited the maximum values in magnetostriction, with that of the 0.5% B-added sheets passing through a peak value of 103 ppm at 3 h, and then decreases to the lower values with further annealing time. The peak magnetostriction of the 1.0% B-added sheets jumps up to a peak of 184 ppm at 4 h. It is possible that the lower magnetostriction in the 0.5% B-added sample results from the higher than expected Ga content in sample determined by AES.

TABLE I

Concentration of each element in Fe—18.7% Ga alloy with 0.5% B by AES.

| Concentration (at. %) | Purposed concentration | Arc-melted button | Annealed sheet at 1200° C. for 4 h | |
|---|---|---|---|---|
| | | | As-received (Oxide layer) | Removal of oxide (Clear surface) |
| Fe | 80.90 | 80.30 | 26.79 | 75.35 |
| Ga | 18.60 | 18.00 | 34.38 | 21.51 |
| B  | 0.50  | 0.93  | 2.10  | 1.14  |
| O  | 0     | 0.77  | 36.73 | 2.00  |

$Fe_2B$ precipitates, which have been in the matrix of starting materials, were used as primary grain growth inhibitor such as AlN and MnS in the Fe-3% Si alloy. Therefore, it is believed that the inhibition of primary grain growth by fine $Fe_2B$ particles promotes secondary recrystallization of the {110}<001> and {100}<001> orientations during high temperature annealing in the 1.0% B-added Fe—Ga alloy.

Results for Example 3

Thin sheets of B-added Fe-18.7% Ga alloy were successfully fabricated to thickness of 0.35 mm using rolling processes, where the B atoms were distributed not only within the grains, but also in the grain boundaries. Boron had a great effect on improvement of ductility due to a strong tendency to segregate to grain boundaries. The annealed sheet with 1.0% B exhibits an excellent magnetostriction of 184 ppm. The $Fe_2B$ precipitates in the α-iron matrix were used as primary grain growth inhibitor and promoted secondary recrystallization of the {110}<001> and {100}<001> orientations during high temperature annealing in the 1.0% B-added Fe—Ga alloy.

While several embodiments of the disclosure have been described, it is not intended that the disclosure be limited thereto, as it is intended that the disclosure be as broad in scope as the art will allow and that the specification be read likewise. Therefore, the above description should not be construed as limiting, but merely as exemplifications of embodiments. Those skilled in the art will envision other modifications within the scope and spirit of the claims appended hereto.

The invention claimed is:

1. A method of shaping a starting material of polycrystalline Fe—Ga alloy sheet of varying texture or crystal orientation, said method comprising:
   texturing the surface of the Fe—Ga alloy sheet to re-orient polycrystalline Fe—Ga crystals of the polycrystalline Fe—Ga alloy sheet to increase the uniformity of the crystal orientation of the Fe—Ga alloy sheet to have a {110}<001>orientation according to the standard notation of Miller's indices, wherein the texturing step includes:
   initially deforming the Fe—Ga alloy sheet by hot rolling;
   subsequently deforming the previously hot rolled Fe—Ga alloy sheet by warm rolling; and
   annealing the previously warm rolled Fe—Ga alloy sheet during a time period greater than one hour and at a temperature greater than or equal to 1000° C., wherein the method provides an alloy having a saturation magnetostriction potential greater than 60 ppm in applied fields of between 200-600 Oersted, wherein during the annealing step $H_2S$ gas is added to introduce sulfur for promoting surface-energy-induced selective growth of {110} grain, wherein the annealing step is performed in an atmosphere of argon gas.

2. The method of claim 1 wherein the Fe—Ga alloy sheet contains one or more addition elements selected from the group consisting of beryllium, boron, cesium, carbon, chromium, cobalt, copper, germanium, hafnium, iridium, lead, manganese, molybdenum, nickel, niobium, nitrogen, oxygen, phosphorus, platinum, rhenium, rhodium, ruthenium, silicon, sulfur, tantalum, thorium, titanium, vanadium, and zirconium.

3. The method of claim 1 wherein the crystal orientation is a goss texture.

4. The method of claim 1 wherein the annealing step includes double annealing by first annealing at 1000° C. for 6 hours and then annealing at 1200° C. for 1 hour.

5. The method of claim 1 further comprising pre-treating the polycrystalline Fe—Ga alloy having a predetermined first thickness, first length, and first width.

6. The method of claim 5 wherein the step of pre-treating further comprises enclosing the alloy in a steel can.

7. The method of claim 6 further comprising oxidizing the can by heating the can to 1000° C. for 1 hour.

8. The method of claim 5 wherein the step of texturing further comprises rolling the Fe—Ga alloy at a first temperature to decrease the first thickness of the Fe—Ga alloy to a second thickness.

9. The method of claim 1, further comprising a step of placing the Fe—Ga alloy sheet in a container prior to the step of initially deforming the Fe—Ga alloy sheet by hot rolling.

* * * * *